(12) United States Patent
Veendrick et al.

(10) Patent No.: US 8,874,394 B2
(45) Date of Patent: Oct. 28, 2014

(54) SIMPLE AND STABLE REFERENCE FOR IR-DROP AND SUPPLY NOISE MEASUREMENTS

(75) Inventors: Hendricus Joseph Maria Veendrick, Heeze (NL); Marcel Pelgrom, Helmond (NL); Victor Zieren, Valkenswaard (NL)

(73) Assignee: NXP, B.V., Eindhoven (NL)

( * ) Notice: Subject to any disclaimer, the term of this patent is extended or adjusted under 35 U.S.C. 154(b) by 692 days.

(21) Appl. No.: 13/132,550

(22) PCT Filed: Nov. 18, 2009

(86) PCT No.: PCT/IB2009/055139
§ 371 (c)(1),
(2), (4) Date: Jun. 2, 2011

(87) PCT Pub. No.: WO2010/064161
PCT Pub. Date: Jun. 10, 2010

(65) Prior Publication Data
US 2011/0246110 A1    Oct. 6, 2011

(30) Foreign Application Priority Data

Dec. 5, 2008   (EP) ..................................... 08170829
Dec. 17, 2008  (EP) ..................................... 08171925

(51) Int. Cl.
*G01R 19/00* (2006.01)
*G01R 29/26* (2006.01)
*G05D 3/12* (2006.01)
*G01R 19/165* (2006.01)
*G01R 31/30* (2006.01)

(52) U.S. Cl.
CPC ...... *G01R 31/3004* (2013.01); *G01R 19/16552* (2013.01); *G01R 19/16571* (2013.01)

USPC .............................. 702/64; 324/613; 700/298

(58) Field of Classification Search
USPC ......... 702/64, 57, 60, 65, 69, 72, 81, 84, 127, 702/182–183, 188–190; 324/76.52, 76.77, 324/613, 750.3, 764.01; 700/286, 291, 700/293–294, 297–298
See application file for complete search history.

(56) References Cited

U.S. PATENT DOCUMENTS 7,359,811 B1   4/2008   Liu ................................ 702/69
7,538,570 B2   5/2009   Pelgrom et al. ............ 324/750.3

(Continued)

FOREIGN PATENT DOCUMENTS

CN   101149977 A   3/2008
EP   0214049 A1   3/1987

(Continued)

OTHER PUBLICATIONS

Petrescu et al., Monitors for a Signal Integrity Measurement System, 2006 IEEE, pp. 122-125.*

(Continued)

*Primary Examiner* — Toan Le (57) ABSTRACT

Apparatus and method for IR-drop and supply noise measurements in electronic circuits. A first voltage at a point of interest in the circuit is sampled and stored during a quiescent mode of the circuit the voltage is to be measured in. Subsequently, the circuit is brought in an operating mode and a second voltage is sampled and held at the same point of interest. The first and the second voltage are compared and a corresponding voltage signal is passed to a system output.

14 Claims, 4 Drawing Sheets

(56) References Cited

U.S. PATENT DOCUMENTS

| | | |
|---|---|---|
| 2002/0133748 A1 | 9/2002 | Corr |
| 2002/0186053 A1 | 12/2002 | Einfeldt |
| 2006/0214672 A1 | 9/2006 | Jenkins et al. .............. 324/713 |
| 2007/0288182 A1* | 12/2007 | Douriet et al. ................ 702/64 |
| 2008/0055018 A1 | 3/2008 | Umamichi et al. .......... 333/181 |
| 2008/0089143 A1 | 4/2008 | Do |

FOREIGN PATENT DOCUMENTS

| | | |
|---|---|---|
| GB | 2 415 055 A | 12/2005 |
| WO | 2007/057725 A1 | 5/2007 |

OTHER PUBLICATIONS

Nagata, M., et al. "A Built-in Technique for Probing Power Supply and Ground Noise Distribution Within Large-Scale Digital Integrated Circuits", IEEE J. of Solid-State Circuits, pp. 813-819 (Apr. 2005).

Abramzon, V., et al. "Scalable Circuits for Supply Noise Measurement", Proc. of the 31$^{st}$ European Solid-State Circuits Conf, pp. 463-466 (Sep. 2005).

International Search Report and Written Opinion for Int'l. Patent Appln. No. PCT/IB2009/055139 (Mar. 16, 2010).

\* cited by examiner

SIMPLE AND STABLE REFERENCE FOR IR-DROP AND SUPPLY NOISE MEASUREMENTS

FIELD OF THE INVENTION

The present invention relates to supply voltage monitoring, and in particular to IR-drop and supply noise measurements.

BACKGROUND OF THE INVENTION

As manufacturing technology advances, semi-conductor integrated circuits (ICs) placed on a single chip become larger and denser. Due to long distribution paths for the power supply voltages so-called IR-drop may cause insufficient voltage supplied to some devices of the IC. Especially when an IC is operated in a high performance operating mode, IR-drop can be significant.

Measuring voltage drop and/or voltage excursion is a very common problem and many solutions exist. Further, since the chip area of an IC may be very large, the supply voltage may vary depending on the point of measurement. Furthermore, if the power consumption in a certain operating mode is relatively high, the impedance of the circuit may cause a significant drop of the local supply voltage too. This, in turn, may also influence the robustness of operation of the circuit besides other reasons which influence the robustness and reliability of the circuits, such as supply noise, substrate noise, temperature, switching activity and clock duty cycle. To detect and later on deal with these effects, monitoring and measuring means are known but some constrains limit the possibilities for proper measurement and monitoring: Feeding additional lines to the points of interest on the chip and performing measurement at the outside of the chip is not desirable. Firstly, this would waste chip area. Secondly, since additional lines may pick up signals that do not actually exist on the measurement points. Thirdly, such additional lines would require additional external pins. Furthermore, building a full-fetched Analog-to-Digital converter would cost too much IC area and pose additional power constraints.

US 2006/0214672 discloses preconditioning of a first signal and a second signal, the first signal being representative of the voltage of the power supply line being monitored and the second signal being representative of the voltage of a reference power supply line. Then, the preconditioned first signal and second signals are compared by a comparator circuitry. This requires presence of reference voltage and an additional supply line from the voltage source to the point of comparison.

WO 2006/114727 discloses an integrated circuit with a distributed supply voltage monitoring system in which a reference voltage is retrieved from the local supply voltage by averaging in a low pass filter and D/A converting the filtered signal.

Summarizing approaches in the prior art either supply the comparison circuitry with an external reference voltage, or generate a reference signal by some kind of signal processing such as averaging a local supply voltage present in the proximity of the comparison means. Disadvantages of these types of monitoring are the need for additional reference signal supply lines and/or comparison of the local supply voltage with a filtered value of the local supply voltage. However, the filtered voltage does not represent the supply voltage as fed to the circuit, but the supply voltage diminished by the IR-drop at that specific location.

SUMMARY OF THE PRESENT INVENTION

It is therefore an object of the present invention to provide an improved IR-drop monitor, that does not need the routing of external reference signals.

This object is solved by an apparatus according to claim 1.

Accordingly, an integrated circuit for monitoring a voltage in an electronic circuit comprises a sampling unit, a storage unit and a comparing unit. The sampling unit is configured for sampling a voltage to be monitored during a first operating mode of the electronic circuit. The storage unit is configured for storing a first value representing the voltage and for providing the first value to the comparing unit. A second value corresponding to the voltage to be monitored during a second operating mode of the electronic circuit is subsequently provided to the comparing unit being configured for comparing the first and the second value.

Optionally, a low pass filtering unit may be introduced to the arrangement. The low pass filtering unit is arranged for low pass filtering the voltage before said second value is determined based on said voltage.

A control unit may then evaluate the comparison result and take appropriate actions e.g. for adjusting the power supply or alerting the respective environment about the currently less robust mode, the circuit is operating in.

Accordingly, rather than averaging a supply voltage value retrieved during operation of the circuit, the invention discloses storing a supply voltage value obtained while the circuit is in a quiescent state. Thus, the supply voltage reference value is not reduced by the IR-drop. In other words, a clean supply voltage value is used as reference value, which is not affected by noise and IR drop, wherein the clean reference value may be the local voltage value of the supply voltage to be monitored, when there is no activity in the chip.

In a further development of the invention the integrated circuit further comprises a noticing unit and/or an actuating unit for noticing the operating mode of the electronic circuit and/or controlling the operating mode of the electronic circuit e.g. by starting and stopping the global clock of the electronic circuit. Depending on how the different operating modes of the electronic circuit are controlled, the integrated circuit this way may either react onto a switched operating mode or switch the operating mode autonomously. A switch for starting and stopping the global clock may for example be embodied as a single transistor.

According to another further development of the invention the integrated circuit further comprises at least one respective voltage dividing unit or voltage level shifting unit for dividing the sampled voltage and/or for dividing the monitored voltage. By the respective dividing or shifting unit, the voltage levels to be compared by the comparator unit can be lowered, thereby enabling comparison of voltage peaks or overshoots. Further, by means of shifting or dividing the voltage level also more headroom is left to the local supply voltage by which the comparator is powered.

One possible embodiment for a divider unit may be a digital-to-analog (D/A)-converter that is well known in the art. The D/A-converter limits the voltage signal being passed to the comparison means by subdividing the input voltage. The division factor may be set by a respective control unit to the D/A-converter. Further, the setting of the A/D-converter may be controlled by an external serial scan chain. Moreover, it is worth to be noted that the function of the (low pass) filtering unit may also be established by elements of the D/A-converter, if the filtering resistor and capacitor form elements of the D/A converter. Accordingly, in a certain embodiment the voltage divider unit arranged for dividing the monitored voltage is embodied by the D/A-converter and forms together with a capacitor the low pass filtering unit. Thereby, area of the integrated circuit that would be required for extra low pass filtering unit may be saved.

In certain embodiments of the integrated circuit the first operating mode is a quiescent mode and the second operating mode is a high power consuming operating mode. Thus, the reference voltage sampled during the quiescent mode is not significantly lowered by operation induced IR drops. This enables monitoring not only short term voltage drops but also general supply voltage attenuation.

In another embodiment, the dividing unit or voltage level shifting unit for dividing the sampled voltage is comprised of a first and a second capacitor having approximately the same capacities. By distributing the charge of the first capacitor, which charge results from the stored reference voltage to both the first and the second capacitor, the remaining voltage is approximately half of the originally stored voltage, yielding a reasonable reference voltage for later comparison.

In a preferred embodiment, the electronic circuit to apply the integrated circuit in is a digital CMOS circuit. Accordingly, not only the electronic circuit but also the integrated circuit may be embodied in CMOS circuit, if appropriate. Advantages of this embodiment are low manufacturing costs, low area consumption and less additional weight imposition to the device.

The object is further solved by a method of monitoring a voltage, in an electronic circuit according to claim 10.

Accordingly, the method comprising the following steps: During a first operating mode of the electronic circuit sampling the voltage and storing a first value representing the voltage; during a second operating mode of the electronic circuit low pass filtering the voltage yielding a second value; and comparing the D/A-converted second value to the stored first value.

The steps of the method may also comprise dividing of the stored value and/or dividing of the voltage during a second mode of the electronic circuit or the second value. The advantages of these additional steps are described in connection with the embodiments of the integrated circuit according to the present invention above.

The steps of the method may further comprise noticing the operating mode of the electronic circuit and/or changing the operating mode of the electronic circuit e.g. by starting and stopping a global clock.

The steps of the previous method can be carried out by a computer program comprising program code means when the computer program is carried out on a computer such as a programmable microcontroller or a respective hard wired control circuit.

The present invention further extends to an integrated circuit comprising the preceding system.

These and other aspects of the present invention will become apparent from the description in connection with the preferred embodiments described in connection with the figures below.

BRIEF DESCRIPTION OF THE DRAWINGS

These and other aspects of the invention will be apparent from and elucidated with reference to the embodiment(s) described hereinafter. In the following drawings, the figures are schematically drawn and not true to scale, and identical reference numerals in different figures, if any, may refer to corresponding elements. It will be clear for those skilled in the art that alternative but equivalent embodiments of the invention are possible without deviating from the true inventive concept, and that the scope of the invention is limited by the claims only.

DETAILED DESCRIPTION OF THE PREFERRED EMBODIMENTS

In order to aid in understanding the operation of the present invention, a prior art circuit scheme for monitoring supply voltage noise illustrated in FIG. 1 will now be explained in detail.

A low pass filter 2 receives the supply voltage $V_{DD}$ at node 1 as an input signal, and produces by low pass filtering an average voltage $V_{DD,\,av}$. This average signal is supplied to a Digital-to-Analog converter (DAC) 3 which forwards as output a signal $V_{DAC}$ that corresponds to a subdivided value of the average voltage $V_{DD,av}$. The output signal of the DAC, signal $V_{DAC}$, is supplied to a first terminal of a comparator unit 4. The comparator unit 4 is configured to compare the subdivided average voltage signal with the original supply voltage $V_{DD}$, supplied to a second terminal of the comparator unit 4. By comparison of the signals at the first and the second terminal, the comparator unit 4 produces a respective comparison output signal $V_{COMP}$. The comparison signal $V_{COMP}$ may be supplied to a controller unit (not depicted), which may be configured to control the setting of the DAC using a control signal. The DAC may be operated using a successive approximation technique in order to generate an appropriately resolved approximation of the averaged supply voltage $V_{DD,av}$.

Figure 1:
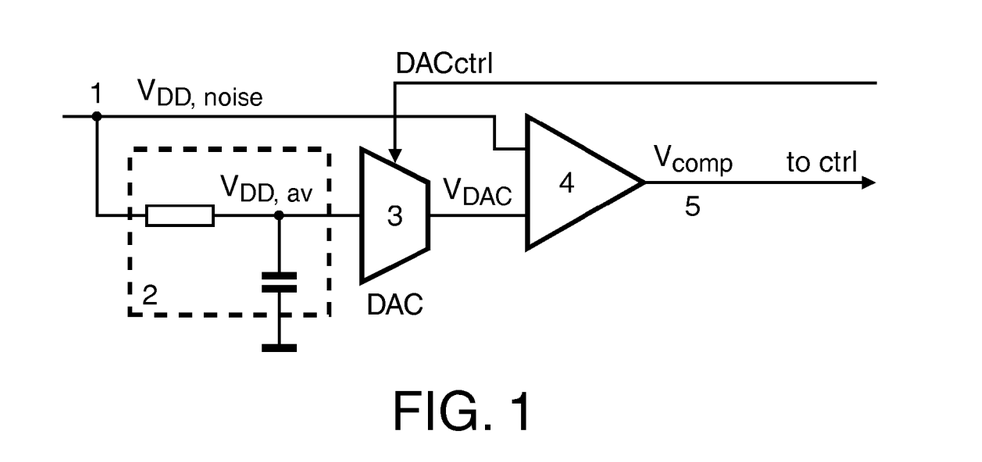
FIG. 1 shows a prior art circuit scheme for monitoring supply voltage noise.

FIG. 1 illustrates a single monitoring circuit connected with a controller unit for the sake of clarity. It will be readily appreciated that each module on the integrated circuit may be provided with a respective monitoring circuit communicating with the controller unit. This means that the controller may be common to a plurality of DACs and can communicate with each one of these. For example, the communication line can connect the monitoring circuits to one another to form a series. The first and last monitoring circuits in the series are connected to the controller. The communications line may be e.g. a single bit line.

Figure 2:
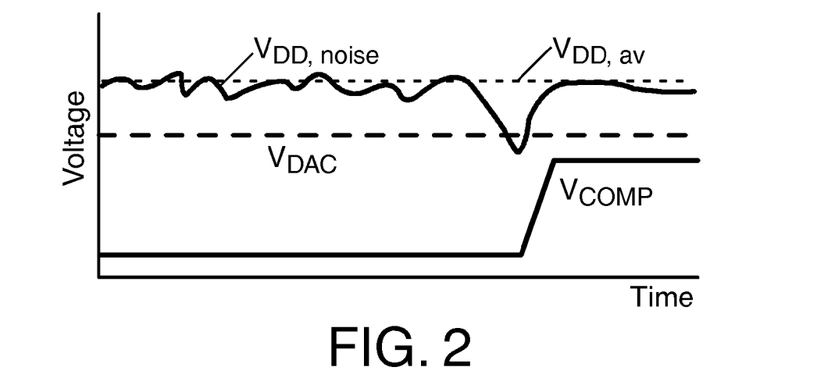
FIG. 2 shows a timing diagram depicting the coherence between the supply voltage noise, the averaged supply voltage, the D/A converted supply voltage and the output signal provided by the comparator.

FIG. 2 shows in form of a timing diagram the coherence between a distorted supply voltage $V_{DD,noise}$, the averaged supply voltage $V_{DD,av}$, the DAC output voltage $V_{DAC}$ and the comparator output voltage $V_{COMP}$. As can be seen from FIG. 2 when the supply voltage $V_{DD}$ suffers a momentary drop or break-in, the comparison signal $V_{COMP}$ changes, thereby indicating this voltage drop to the controller unit.

By using the average supply voltage $V_{DD,av}$ as reference signal, the comparison signal relates to the relative change in supply voltage. This in turn removes the need for a local accurate supply voltage measurement. In this case, the quantity to be measured is $V_{DD,noise}$. The absolute value of this voltage is not so important, however, the spike determines the reliability of the digital circuit. This spike is measured with respect to the average value of the distorted supply voltage $V_{DD,\ noise}$. $V_{DD,\ av}$ is retrieved by $V_{DD,\ noise}$ passing in this example a simple low pass filtering unit comprised of a R-C network, though alternative options are feasible.

The DAC subdivides $V_{DD,\ av}$ yielding $V_{DAC}$ as is depicted in dashed lines in FIG. 2. Operation of the DAC including the dividing ratio is under the control of the control signal DAC-ctrl provided by the controller unit (not shown in FIG. 1). By way of example, when the expected voltage resolution lies in the range of 10 to 20 mV the DAC may be built by an R-2R scheme, which is a very simple topology. For example, for 8 bits of resolution a resistor ladder comprised of "R-2R" chains with nine resistors having a resistance of 2R and seven resistors having a resistance of R are required. Compared with other cheap DAC topologies, the advantage of this scheme is that it has higher frequency performance.

Figure 3:
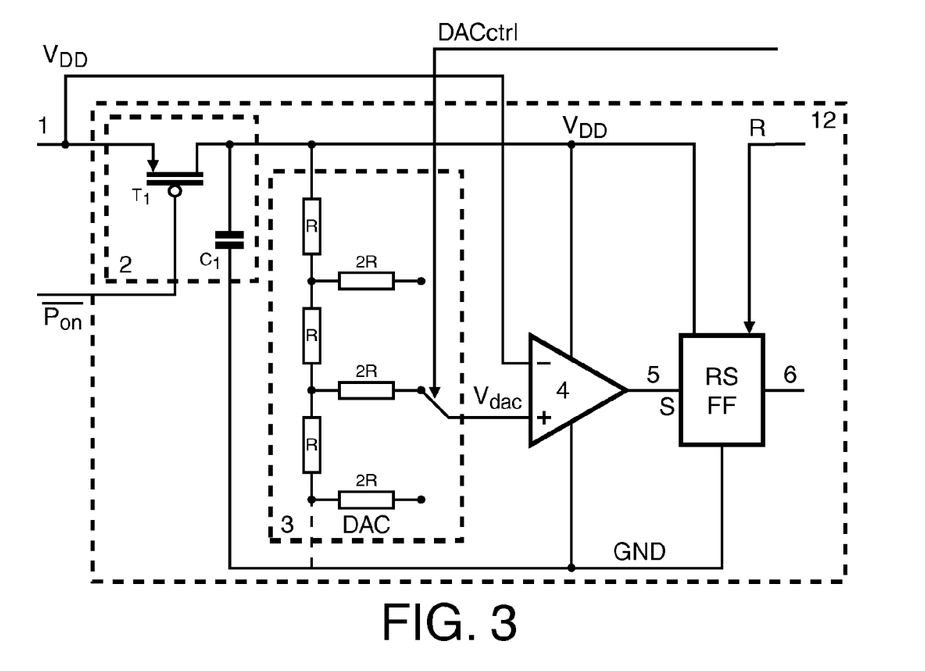
FIG. 3 shows another prior art circuit scheme.

FIG. 3 differs with respect to FIG. 1 in that the resistor of the low pass filtering unit 2 in FIG. 1 is replaced by a transistor $T_1$ controlled by an enable signal $P_{on}$, which in the drawing Figures is referred to as $\overline{P_{ON}}$, i.e. the inverted value of $P_{on}$, simply meaning that the signal is low active. As mentioned earlier, the DAC 3 of FIG. 1 in FIG. 3 is realized by a R-2R network. The actual or momentary result of the comparison, i.e. the output of the comparator unit 4, is stored in an RS-flip-flop 5.

These modifications enable measurement of peaks on top of the power supply, under- and over-shoots on the ground line as well as on the substrate terminal. The transistor $T_1$ allows via the signal $P_{on}$, to enable and to disable the IR-drop monitor 12. In other words, setting the $P_{on}$ signal to logical low, e.g. 0 V, enables the IR-drop monitor 12. The now passed actual supply voltage $V_{DD,\ noise}$ is low passed filtered by low pass filtering unit 2, which is comprised of the source-drain resistor of $T_1$ together with the capacitor C. The thus averaged value of the supply voltage $V_{DD,\ noise}$ is subsequently subdivided by means of the R-2R resistor ladder 3, allowing to compare fractions of $V_{DD,\ noise}$ in the comparator unit 4. The RS flip-flop 5 stores the comparison result output by the comparator unit 4 and provides the result at the system output 6. The RS flip-flop 5 further has terminals for power supply, ground and a reset line for resetting the stored comparison result by an external control signal, e.g. from the control unit (not shown in FIG. 3).

Figure 4:
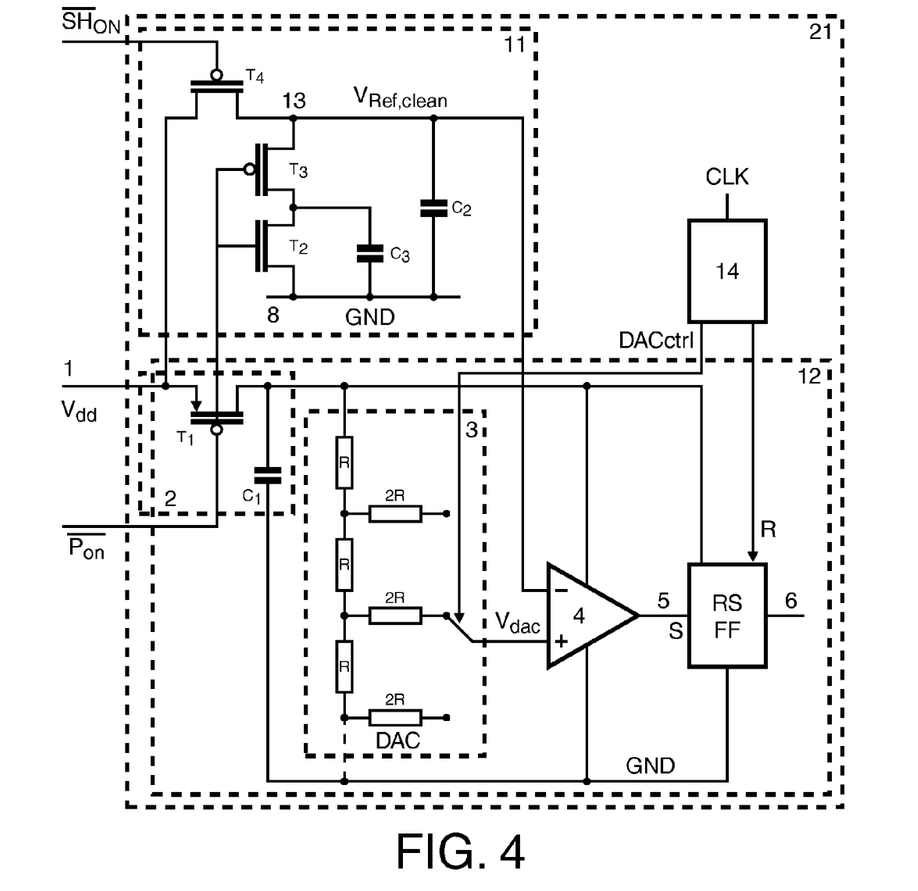
FIG. 4 shows a circuit scheme according to one embodiment of the present invention.

FIG. 4 shows a circuit arrangement according to one embodiment of the present invention. Apparent is the newly introduced sample and hold (S/H) unit 11 which is comprised of transistor $T_4$ and capacitor $C_2$. The S/H unit 11 further comprises a voltage dividing or voltage level shifting unit, which is exemplary embodied by two transistors $T_2$, $T_3$ and capacitor $C_3$. The source-drain paths of the transistors $T_2$ and $T_3$ are connected in series between the node 13 and ground GND of the whole circuit. Moreover, transistors $T_2$ and $T_3$ are of complementary type and controlled by a same control signal $P_{on}$ at the respective gate terminals of $T_2$ and $T_3$ so that if transistor $T_2$ is conducting transistor $T_3$ is not, and vice versa.

The S/H unit 11 is connected to node 1 as input, at which the actual supply voltage $V_{DD}$ is present. Further, the S/H unit 11 is configured to provide a voltage value $V_{ref,\ clean}$ corresponding to a clean supply voltage $V_{DD,\ clean}$ to the negative terminal of the comparator unit 4. The function of the S/H unit 11 will now be explained in detail in the following.

Between node 1 and capacitor $C_2$ of the S/H unit 11 is connected a transistor $T_4$ controlled by a control signal $SH_{on}$, which in the Figures is referred to as $\overline{SH_{ON}}$, i.e. the inverted value of $SH_{on}$, meaning that the signal is also low active. The transistor $T_4$ basically functions as switch for forwarding the actual voltage at node 1 to the S/H unit 11 to be sampled and held by capacitor $C_2$. Sampling and holding of the voltage happens in a first point in time conferred to later. If the control signal $SH_{on}$ enables the conductivity of transistor $T_4$, capacitor $C_2$ samples the actual or momentary value of the supply voltage $V_{DD}$ at node 1. By disabling the conductivity of transistor $T_4$ the sample and hold operation is terminated.

Then by switching the control signal $P_{on}$ the charge stored on capacitor $C_2$ is distributed from capacitor $C_2$ to an optional additional capacitor $C_3$ connected via transistor $T_3$ parallel to $C_2$; it goes without saying that it is assumed that transistor $T_3$ may be treated as a closed switch. This happens in a second point in time conferred to later.

The control signal $P_{on}$ further enables the actual supply voltage $V_{DD}$ to be supplied into the IR-drop monitor. At first, the actual supply voltage $V_{DD}$ is low-pass filtered by the low pass filtering unit 2 discussed in connection with FIG. 3. The actual supply voltage $V_{DD}$ is then applied to the DAC, implemented by the R-2R scheme, so that a predetermined fraction of actual supply voltage $V_{DD}$ is applied to comparator unit 4 for comparison to the reference voltage $V_{Ref,\ clean}$ which corresponds to the subdivided or level shifted value of the sampled supply voltage $V_{DD}$. The voltage level shifting or subdividing factor is predetermined by $C_2/(C_2+C_3)$.

As discussed in connection with FIG. 3 an adjacent RS flip-flop 5 passes the comparison result $V_{COMP}$ to the system output 6. In case the circuit has to be simplified and/or voltage over-shoots are not an object of measurement, the voltage division in the S/H unit 11 just like the R-2R-scheme 3 may be simplified or even omitted.

In the first point in time defined earlier in connection with the function of the sampling and holding of the supply voltage $V_{DD}$, the electronic circuit the voltage is measured in is in a quiescent state. So, IR drop of the supply voltage and noise e.g. due to switching operations in the electronic circuit may be assumed as relatively low. This state may be provoked by switching off the global clock.

In the second point in time when the actual supply voltage $V_{DD}$ is supplied into the IR-drop monitor the electronic circuit the voltage is measured in is in a fully operating state. This state may be provoked by switching on the global clock. IR drops and noise on the supply voltage $V_{DD}$ may then significantly occur. The IR drop monitor according to the present invention 21 this way enables the comparison of the original supply voltage and the supply voltage influenced by the operation of the electronic circuit.

Figure 5:
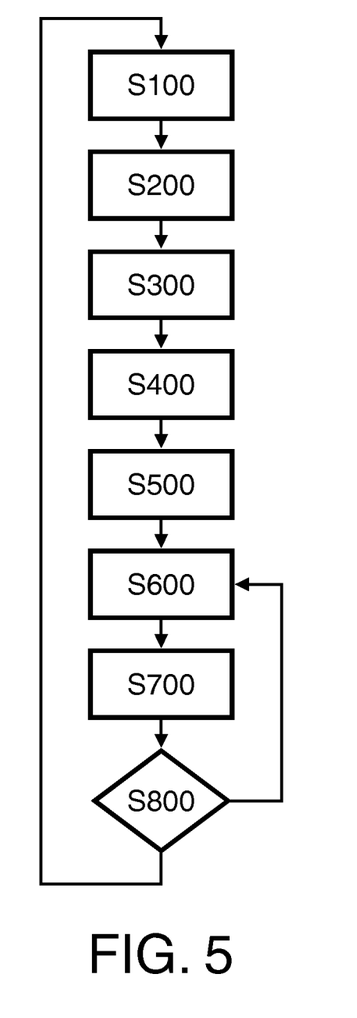
FIG. 5 shows a flowchart depicting the steps of the method according to an embodiment of the present invention.

In connection with FIG. 5 the operation of the circuit scheme according to FIG. 4 will be explained in the following. One basic idea of this invention is the use of the clean supply voltage $V_{DD,\ clean}$, which is not affected by noise and IR-drop. This clean voltage $V_{DD,\ clean}$ is the local supply voltage $V_{DD}$, when there is no significant activity on the chip. In other words, the chip needs to be brought in a full quiescent state, by switching off the global clock CLK. Except for leakage currents, in this mode no significant currents causing IR-drop exist on the chip, and the local $V_{DD}$ should be very close to the externally supplied voltage. Stopping the global clock CLK and starting the IR drop monitor 12 can be realized by several dependencies: Either, the control unit 14 of the IR drop monitor 12 itself stops the global clock CLK e.g. when the system is started up, or the control unit 14 is notified, when the global clock CLK has been stopped by other means. In either case in step S100, the global clock CLK is stopped, provoking the quiescent state of the circuit. Then, in step S200 the now available clean supply voltage $V_{DD,\ clean}$ is sampled and stored on capacitor $C_2$ by setting signal $SH_{ON}$ to logical 0. In step S300 signal $SH_{ON}$ is set to 1 and thereby storing the latest applied voltage. Subsequently, in step S400 the clock is enabled starting the operation of the chip. Preferably, the chip then runs in the most power consuming application. In this mode of operation the largest supply noise and IR-drop is likely to occur. Immediately after running the chip in full operation, in step S500 the $P_{on}$ signal is set to "0", making transistor $T_1$ conductive. Thus, the local supply voltage $V_{DD}$ is applied to the adjacent network section. By setting the signal $P_{on}$ to "0", transistor $T_3$ is made conductive synchronously with $T_1$ and the charge previously stored on capacitor $C_2$ is shared with capacitor $C_3$ through transistor $T_3$. The resulting reference voltage $V_{REF,clean}$ depends on the ratio of both capacitors $C_2$ and $C_3$ as explained above.

In step S600 the resulting voltage $V_{Ref,clean}$ is then used as a reference for the IR-drop monitor, which compares this reference voltage $V_{Ref,clean}$ to a fraction of the filtered voltage $V_{DD, filtered}$. This $V_{DD, filtered}$ voltage is the filtered local supply voltage $V_{DD}$ which includes an IR-drop according to the present operation mode.

In step S700 a voltage representing the comparison result between reference voltage $V_{REF,clean}$ and the fraction of the filtered voltage $V_{DD, filtered}$ is determined in the comparator unit 4. Subsequently, this comparison result $V_{COMP}$ is passed to the RS Flip-Flop 5. At the output 6 of RS Flip-Flop 5, the comparison result $V_{COMP}$ is held available for adjacent controlling means (not displayed in FIG. 4). These controlling means may then e.g. take actions to either react upon changing supply voltage conditions or notify respective means of the diminished robustness and/or reliability of the mode of operation, the circuit is currently operating in.

The IR drop monitor 12 is now continuously monitoring the difference between the clean reference voltage $V_{REF,clean}$ and the fraction of the filtered voltage $V_{DD, filtered}$. As long as the stored reference voltage $V_{REF,clean}$ is not significantly faded and thus still applicable as a reference value, sampling a new reference voltage $V_{REF,clean}$ is not necessary. Operation may continue with step S600. In case reference voltage $V_{REF,clean}$ needs to be refreshed or e.g. the chip is put in a quiescent state for another reason again, in step S800, signal $P_{on}$, is set to "1" and next operation cycle begins with step S100.

It shall be appreciated, that several steps and elements may be alternately lined-up, embodied, combined or divided without departing from the scope of the invention. For example the R-2R scheme may be replaced by another appropriate passive resistor scheme or by a level shifter. Also, other embodiments of the sample and hold arrangement 11 are possible. The order e.g. of the dividing or level shifting means 3 and the low pass filtering means 2 may be switched.

While the invention has been illustrated and described in detail in the drawings and foregoing description, such illustration and description are to be considered illustrative and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single . . . or other unit may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. An integrated circuit for monitoring a voltage in an electronic circuit, the integrated circuit comprising:
    at least one sample unit;
    at least one storage unit;
    at least one comparator unit;
    the sample unit being configured for sampling a voltage during a first operating mode of the electronic circuit in which the global clock of the electronic circuit is switched off and the storage unit being configured for storing a first value representing the voltage; and
    the comparator unit being configured for comparing a second value representing a voltage during a second operating mode of the electronic circuit and the first value during a second operating mode of the electronic circuit.

2. The integrated circuit according claim 1 further comprising at least one low pass filter unit being arranged for low pass filtering said second voltage before represented by said second value.

3. The integrated circuit according to claim 1 further comprising at least one of a noticing unit for noticing the operating mode of the electronic circuit and an actuating unit for controlling the operating mode of the electronic circuit by starting and stopping the global clock of the electronic circuit.

4. The integrated circuit according to claim 3, wherein the actuating unit includes transistors.

5. The integrated circuit according to claim 1 further comprising at least one of a voltage divider and a level shifter enabling division of at least one of the sampled voltage and the monitored voltage.

6. The integrated circuit according to claim 5, wherein the divider arranged for dividing the monitored voltage is embodied as a D/A converter including a resistor and a capacitor forming the low pass filter unit.

7. The integrated circuit according to claim 1 further comprising a controller controlling at least the operation of one integrated circuit.

8. The integrated circuit according to claim 1, wherein the first mode is a quiescent mode and the second mode is a high power consuming operating mode.

9. The integrated circuit according to claim 1, wherein at least two capacitors in the sample and hold unit have approximately the same capacities.

10. A method of monitoring a voltage in an electronic circuit, the method comprising the steps of:
    during a first operating mode of the electronic circuit in which the global clock of the electronic circuit is switched off, sampling the voltage and storing a first value representing the voltage using an integrated circuit;
    during a second operating mode of the electronic circuit, retrieving a second value representing a second voltage using the integrated circuit; and
    comparing the second value to the stored first value using the integrated circuit.

11. The method according claim 10 wherein the second voltage is low-pass-filtered before retrieving said second value.

12. The method according to claim 10 further comprising the steps of at least one of dividing the stored value and dividing the voltage during a second mode of the electronic circuit or the second value.

13. The method according to claim 10 further comprising the steps of at least one of noticing the mode of the electronic circuit and changing the mode of the electronic circuit by starting and stopping the global clock.

14. A computer program stored in a non-transitory computer readable medium comprising program code, which cause a computer to carry out the steps of the method as claimed in claim 10, when said computer program is carried out on a computer.

\* \* \* \* \*